(12) United States Patent
Min

(10) Patent No.: US 10,234,112 B2
(45) Date of Patent: Mar. 19, 2019

(54) LIGHT SOURCE MODULE AND LIGHTING DEVICE HAVING SAME

(71) Applicant: LG INNOTEK CO., LTD., Seoul (KR)

(72) Inventor: Byeong Guk Min, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 0 days.

(21) Appl. No.: 15/779,455

(22) PCT Filed: Nov. 22, 2016

(86) PCT No.: PCT/KR2016/013476
§ 371 (c)(1),
(2) Date: May 25, 2018

(87) PCT Pub. No.: WO2017/090956
PCT Pub. Date: Jun. 1, 2017

(65) Prior Publication Data
US 2018/0259166 A1 Sep. 13, 2018

(30) Foreign Application Priority Data
Nov. 27, 2015 (KR) .................. 10-2015-0167093

(51) Int. Cl.
*F21V 19/00* (2006.01)
*H05K 1/18* (2006.01)
(Continued)

(52) U.S. Cl.
CPC .............. *F21V 19/002* (2013.01); *F21K 9/00* (2013.01); *F21K 9/20* (2016.08); *F21S 2/00* (2013.01);
(Continued)

(58) Field of Classification Search
CPC ....... F21V 19/002; F21V 23/06; H05K 1/181; F21K 9/20
See application file for complete search history.

(56) References Cited

U.S. PATENT DOCUMENTS

2006/0171135 A1   8/2006   Ishizaka et al.
2011/0316009 A1   12/2011  Fukasawa
2012/0217877 A1   8/2012   Shin et al.

FOREIGN PATENT DOCUMENTS

JP    2006-222412      8/2006
KR    10-2011-0129619  12/2011
(Continued)

OTHER PUBLICATIONS

International Search issued in Application Report (with English Translation) and Written Opinion dated Mar. 16, 2017 No. PCT/KR2016/013476.

*Primary Examiner* — Joseph L Williams
(74) *Attorney, Agent, or Firm* — KED & Associates, LLP

(57) ABSTRACT

An embodiment discloses a light source module. The disclosed light source module includes: a circuit board; and a plurality of light emitting diodes arranged on the circuit board, wherein the plurality of light emitting diodes include a plurality of first light emitting diodes connected to a power input terminal, and a plurality of second light emitting diodes connected to output ends of the plurality of first light emitting diodes, wherein the plurality of first light emitting diodes are spaced apart from each other, and at least two of the plurality of second light emitting diodes are disposed between the first light emitting diodes, respectively.

20 Claims, 6 Drawing Sheets

(51) Int. Cl.

| | | |
|---|---|---|
| *F21K 9/00* | (2016.01) | |
| *F21S 2/00* | (2016.01) | |
| *F21K 9/20* | (2016.01) | |
| *F21V 23/06* | (2006.01) | |
| *F21Y 103/10* | (2016.01) | |
| *F21Y 115/10* | (2016.01) | |
| *H01L 25/13* | (2006.01) | |
| *H01L 33/48* | (2010.01) | |
| *H01L 33/50* | (2010.01) | |
| *H01L 33/54* | (2010.01) | |
| *H01L 33/62* | (2010.01) | |

(52) U.S. Cl.
CPC ............. *F21V 23/06* (2013.01); *H05K 1/181* (2013.01); *F21Y 2103/10* (2016.08); *F21Y 2115/10* (2016.08); *H01L 25/13* (2013.01); *H01L 33/486* (2013.01); *H01L 33/507* (2013.01); *H01L 33/54* (2013.01); *H01L 33/62* (2013.01); *H05K 2201/10106* (2013.01); *H05K 2201/10522* (2013.01)

(56) References Cited

FOREIGN PATENT DOCUMENTS

| KR | 10-2012-0097654 | 9/2012 |
|---|---|---|
| WO | WO 2014/092499 | 6/2014 |

LIGHT SOURCE MODULE AND LIGHTING DEVICE HAVING SAME

CROSS-REFERENCE TO RELATED PATENT APPLICATIONS

This application is a U.S. National Stage Application under 35 U.S.C. § 371 of PCT Application No. PCT/KR2016/013476, filed Nov. 22, 2016, which claims priority to Korean Patent Application No. 10-2015-0167093, filed Nov. 27, 2015, whose entire disclosures are hereby incorporated by reference.

TECHNICAL FIELD

Embodiments relate to a light source module and a lighting device having the same.

BACKGROUND ART

Electronic devices such as various mobile phones and TVs have been developed. These electronic devices are equipped with a printed circuit board (PCB) with various parts, which are components enabling operation of the electronic devices, mounted therein.

A light emitting diode (hereafter, referred to as an LED), which is a diode that emits light when a current is supplied, is a light emitting device in which electrons are excited to a higher energy level when a small number of carriers are injected into an active layer and the energy of the electrons is emitted as electromagnetic waves having the wavelength of light when the electrons return to the stable state.

Recently, LEDs can be manufactured with high luminance and quality over a common product with low brightness by virtue of rapid development of semiconductor technology. Further, as high-performance blue and white diodes can be implemented, the availability of LEDs is being expanded to advance lighting sources, various displays etc. A device formed in a predetermined size by a single LED or by coupling a plurality of LEDs is called an LED module, which is used for various displays and imaging devices.

DISCLOSURE

Technical Problem

An embodiments provide a light source module capable of reducing an imbalance in light distribution among a plurality of light emitting diodes disposed on a circuit board.

Embodiments provide a light source module capable of dispersing a low current or a low current flowing when the power is off.

Embodiments provide a light source module that emits light through a plurality of light emitting diodes dispersed a low current flowing into a power supply end.

An embodiment is a light source module that a second light emitting diode is disposed between a plurality of first light emitting diodes connected to a power input terminal on a circuit board so that a low current flowing into the power input terminal is emitted light through the first light emitting diode in different regions.

An embodiment provide a light source module that has at least one first light emitting unit connected to a power input terminal and at least one second light emitting unit connected to the first light emitting unit, and has each of the second light emitting diodes of the second light emitting unit disposed between the first light emitting diodes of the first light emitting unit.

Embodiments provide a light source module in which a plurality of first light emitting diodes connected in parallel, series, series-parallel, or bottle-serial manner to first polarity terminals on a circuit board are distributed among second light emitting diodes.

Embodiments provide a light source module for arranging a plurality of first light emitting diodes of a first light emitting unit connected to a power supply end in a circuit board respectively between second light emitting units having a plurality of second light emitting diodes.

An embodiment provides a light source module for arranging a plurality of first light emitting diodes of a first light emitting unit connected to a power supply terminal in a circuit board between a second light emitting units having a plurality of second light emitting diodes, respectively.

Embodiments provide a light source module in which first light emitting diodes of a plurality of first light emitting units are disposed between plurality of second light emitting units, respectively.

Embodiments provide a light source module in which a plurality of first light emitting diodes are distributed among second light emitting units on one or a plurality of circuit boards.

Technical Solution

A light source module according to an embodiment includes: a circuit board; and a plurality of light emitting diodes arranged on the circuit board, wherein the plurality of light emitting diodes include a plurality of first light emitting diodes connected to a power input terminal, and a plurality of second light emitting diodes connected to output ends of the plurality of first light emitting diodes Wherein the plurality of first light emitting diodes are spaced apart from each other, and at least two of the plurality of second light emitting diodes are disposed between the first light emitting diodes, respectively.

A light source module according to an embodiment includes: a circuit board; and a plurality of first light emitting units having a plurality of first light emitting diodes arranged on the circuit board; and a plurality of second light emitting units connected to the first light emitting unit on the circuit board and having a plurality of second light emitting diodes, wherein the plurality of first light emitting units are connected to each other, and units, the plurality of first light emitting diodes disposed in each of the plurality of first light emitting diodes are spaced apart from each other, the plurality of second light emitting units are connected to each other, the plurality of second light emitting diodes disposed in each of the plurality of second light emitting units are connected to each other, and each of the second light emitting units which is connected from each other is disposed between the first light emitting diodes of the first light emitting unit.

According to an embodiment, the plurality of first light emitting units having the plurality of first light emitting diodes are connected in series, and each of the plurality of first light emitting units is connected to at least two first light emitting diodes in parallel.

According to an embodiment, the plurality of second light emitting units having the plurality of second light emitting diodes are connected in series, each of the plurality of second light emitting units includes at least two second light emitting diodes connected in parallel, and at least two second light emitting diodes connected in parallel between the first light emitting diodes disposed in each of the first light emitting units may be disposed.

According to an embodiment, the first light emitting unit has three or more first light emitting diodes connected in parallel, and the number of the second light emitting diodes of each second light emitting unit is equal to the number of the first light emitting diodes of each first light emitting unit.

According to an embodiment, the plurality of second light emitting diodes may be arranged in one row between the first light emitting diodes, and the plurality of first light emitting diodes and the plurality of second light emitting diodes may be arranged in a single row.

According to the embodiment, the plurality of first light emitting units may be connected in series between the power supply input terminal and the plurality of second light emitting units.

According to the embodiment, a plurality of the circuit boards may be arranged, and the first light emitting unit and the second light emitting unit may be disposed on the plurality of circuit boards.

According to the embodiment, the circuit board includes a connector, and the connector can be connected to the positive terminal of the first light emitting unit.

According to the embodiment, the number of the first light emitting diodes on the circuit board may be 30% or less of the total number of the light emitting diodes.

According to an embodiment, an interval between the first light emitting diodes may be three times or more the interval between the second light emitting diodes.

According to an embodiment, the first light emitting diode of the first light emitting unit can emit light abnormally by a DC power source of a non-normal level drawn into the circuit board.

Advantageous Effects

The embodiment can disperse an afterglow in the light source module over the entire area of the circuit board.

The embodiment can improve the light unbalance due to afterglow in the entire area of the light source module.

Embodiments can improve the reliability of the light source module and the illumination device having the same.

BEST MODE

The embodiments may be modified in other forms or various embodiments may be combined with each other, and the scope of the present invention is not limited to each embodiment described below. Although the description in the specific embodiments is not described in the other embodiments, other embodiments may be understood as being related to the other embodiments unless otherwise described or contradicted by those in the other embodiments. For example, if the features for configuration A are described in a particular embodiment and the features for configuration B are described in another embodiment, even if the embodiment in which configuration A and configuration B are combined is not explicitly described, It is to be understood that they fall within the scope of the invention.

Hereinafter, embodiments of the present invention capable of realizing the above objects will be described with reference to the accompanying drawings. In the description of embodiments according to the present invention, in the case of being described as being formed "on or under" of each element, the upper (upper) or lower (lower) or under are all such that two elements are in direct contact with each other or one or more other elements are indirectly formed between the two elements. Also, when expressed as "on or under", it may include not only an upward direction but also a downward direction with respect to one element. Hereinafter, embodiments of the present invention will be described in detail with reference to the accompanying drawings so that those skilled in the art can easily carry out the present invention.

Figure 1:
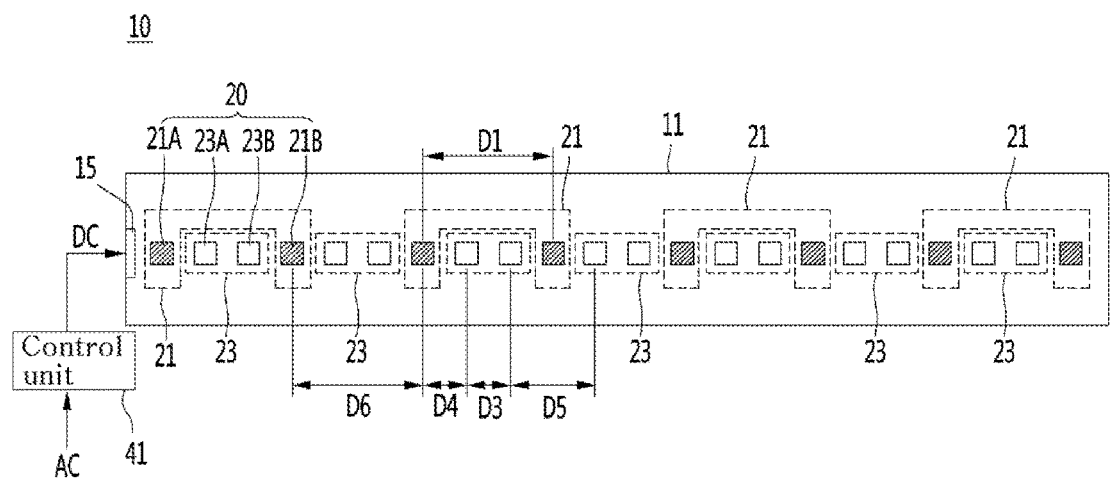
FIG. 1 is a plan view of a light source module according to an embodiment.
Figure 2:
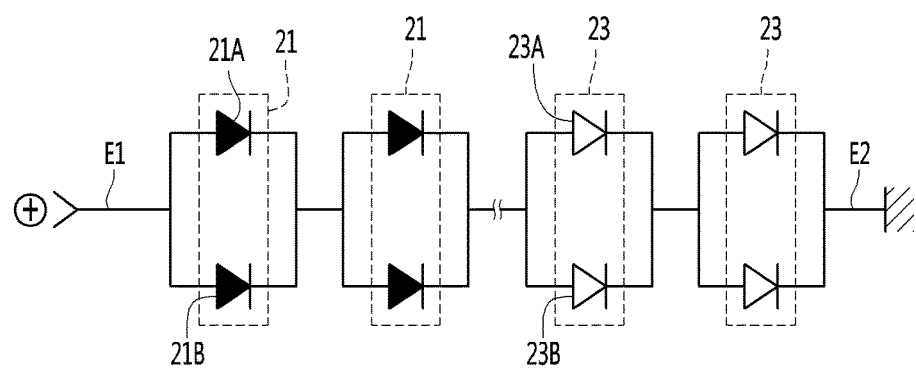
FIG. 2 is a circuit diagram of the light source module of FIG. 1.

FIG. 1 is a plan view of a light source module according to an embodiment, and FIG. 2 is a circuit diagram of a light source module of FIG. 1.

FIGS. 1 and 2, the light source module 10 includes a circuit board 11, first light emitting unit 21 and second light emitting unit 23 having a light emitting diode 20 arranged on the circuit board 11. The plurality of light emitting diodes 20 on the circuit board 11 may be arranged in at least one column or two or more columns. The first light emitting unit 21 may include a plurality of first light emitting diodes 21A and 21B. The second light emitting unit 23 may include a plurality of second light emitting diodes 23A and 23B. The light emitting diode 20 may include first light emitting diodes 21A and 21B of the first light emitting unit 21 and second light emitting diodes 23A and 23B of the second light emitting unit 23.

The first light emitting unit 21 and the second light emitting unit 23 may be arranged on the circuit board 11 in at least one row. As another example, the first light emitting unit 21 and the second light emitting unit 23 may be arranged in different rows on the circuit board 11.

The transverse length of the circuit board 11 may be longer than the longitudinal length. Here, the direction of the transverse length may be a direction in which the first and second light emitting diodes 21A, 21B, 23A, and 23B are arranged, and the direction of longitudinal length may be a direction orthogonal to the direction of the transverse length. The transverse direction may be a first direction, and the longitudinal direction may be a second direction.

A plurality of light emitting diodes 20 may be arranged in the first direction of the circuit board 11. The lateral length of the circuit board 11 may vary depending on the distances D3 and D4 between the adjacent light emitting diodes 20 and the total number of the light emitting diodes 20. The transverse length of the circuit board 11 may be ten times or more, for example, 15 times or more of the longitudinal length. The circuit board 11 may include a resin printed circuit board (PCB), a metal core PCB (MCPCB), and a flexible PCB (FPCB), but they are not limited thereto.

A connector 15 may be disposed on the circuit board 11 and the connector 15 may supply power to both ends of an array of light emitting diodes 20. The connector 15 may be connected to the control unit 41 and the control unit 41 may supply or cut off the power supplied to the light emitting diodes 20 to control on and off. The control unit 41 includes a power supply unit and converts AC (Alternating Current) power to DC (direct current) power. The control unit 41 may include an AC-to-DC converter.

The light emitting diodes 20 may emit light of the same color, for example, white light. Each of the light emitting diodes 20 may include at least one LED chip that selectively emits light in the ultraviolet band from visible light.

The light emitting diodes 20 may have the same or different color temperatures of white light. The first light emitting diodes 21A and 21B according to the embodiment may be a cool white LED and the second light emitting diodes 23A and 23B may be a warm white LED. As another example, the first light emitting diodes 21A and 21B may be a warm white LED, and the second light emitting diodes 23A and 23B may be a cool white LED. Alternatively, the second light emitting diodes 23A and 23B may be arranged as a warm white LED and a cool white LED. The light source module 10 emits mixed white light emitted by the first and second light emitting diodes 21A, 21B, 23A, and 23B. Accordingly, it is possible to provide a white light source module capable of easily controlling emotional illumination.

The first light emitting unit 21 may be connected to the connector 15 and may receive power. The first light emitting unit 21 may be connected to a power supply terminal for supplying power. The first light emitting unit 21 may be connected to a power source terminal having a first polarity, for example, a positive power source terminal.

The first light emitting unit 21 and the second light emitting unit 23 may be connected in series. The first light emitting unit 21 may be disposed on the circuit board 11, for example, one or more. When a plurality of the first light emitting units 21 are arranged, the plurality of first light emitting units 21 may be connected to each other in series. As another example, the plurality of second light emitting units 21 may be connected to each other in parallel.

The plurality of the second light emitting units 23 may be disposed on the circuit board 11, for example, one or more. The second light emitting unit 23 may be connected to the one or more first light emitting units 21 in series. When the plurality of second light emitting units 23 are arranged, the plurality of second light emitting units 23 may be connected in series with each other. As another example, the plurality of second light emitting units 23 may be connected to each other in parallel.

The first light emitting unit 21 includes a plurality of first light emitting diodes 21A and 21B and the plurality of first light emitting diodes 21A and 21B provided in the first light emitting unit 21 are connected in parallel. The plurality of first light emitting units 21 are connected in series to each other and the plurality of first light emitting diodes 21A and 21B may be connected to one another in parallel. The first light emitting diodes 21A and 21B in at least one first light emitting unit 21 according to the embodiment may be connected in at least one of serial, parallel, serial-parallel, or bottle-serial.

As shown in FIGS. 1 and 2, the anode of the plurality of first light emitting diodes 21A and 21B of the first light emitting unit 21 may be connected to the power input terminal E1. When the plurality of first light emitting units 21 are arranged, an anode of the first light emitting diodes 21A and 21B of the first light emitting unit may be connected to the power input terminal E1. The power input terminal E1 may be a terminal of a first polarity connected to the connector 15, but is not limited thereto. The power input terminal E1 may be a terminal to which a power of the first polarity is inputted or inputted to the plurality of light emitting diodes 20. The power output terminal E2 is a terminal through which power is drawn out or outputted through the plurality of light emitting diodes 20, and a power of the second polarity may be output.

The second light emitting unit 23 includes a plurality of second light emitting diodes 23A and 23B and the plurality of second light emitting diodes 23A and 23B disposed in the second light emitting unit 23 are connected in parallel. The plurality of second light emitting diodes 23A and 23B of the second light emitting unit 23 may be connected to the output ends of the plurality of first light emitting units 21. The anodes of the plurality of second light emitting diodes 23A and 23B may be connected to the output terminals of the plurality of first light emitting units 21. The anodes of the plurality of second light emitting diodes 23A and 23B may be connected to the cathodes of the first light emitting diodes 21A and 21B. when the second light emitting unit 23 is arranged in plurality, an anodes of a first second light diodes 23A and 23B of the first second light emitting unit 23 is connected to the last first light emitting unit 21, the last second light emitting unit 23 may be connected to the second polarity terminal E2 or may be connected to a terminal of another LED array. The number of the first light emitting diodes 21A and 21B of the first light emitting unit 21 may be the same as the number of the second light emitting diodes 31A and 31B of the second light emitting unit 31. The plurality of first light emitting diodes 21A and 21B and the plurality of second light emitting diodes 23A and 23B may be connected in a circuit.

Referring to FIG. 1, the first light emitting diodes 21A and 21B of the first light emitting unit 21 may be disposed at both ends of the second light emitting unit 23, respectively. The first light emitting diodes 21A and 21B may be dispersed with a predetermined interval D1 by the second light emitting unit 23.

The distance D3 between the second light emitting diodes 23A and 23B of the second light emitting unit 23 may be the same as the distance D4 between the first and second light emitting units 21 and 23. The spacing D3 may be the same as the spacing of the light emitting diodes 20 on the circuit board 11. The interval may have a relationship of D3=D4. The interval D4 may be the interval between the adjacent first and second light emitting diodes.

The distance D1 between the first light emitting diodes 21A and 21B of the first light emitting unit 21 may be wider than the intervals D3 and D4. The interval D1 may be three times or more the interval D3. The interval D1 may be three times or more the interval D4. The distance D1 can be obtained by adding the number of the second light emitting diodes 23A and 23B+1 when the distance D3 is 1. For example, when the number of the second light emitting diodes 23A and 23B is 2, the interval D1 can be obtained by 2+1.

The distance D5 between the adjacent second light emitting units 23 may be greater than the distance D3. The distance D6 between adjacent first light emitting units 21 may be greater than the distance D3, for example, may be three times greater than the distance D3. The interval D6 may be equal to or larger than the interval D1.

Since the plurality of first light emitting diodes 21A and 21B are spaced apart from each other by the interval D1 when the normal current or the low current flows into the plurality of first light emitting diodes 21A and 21B, it can generate afterglow.

When the normal level DC power is supplied through the connector 15, 23B are turned on, the first light emitting diodes 21A and 21B of the first light emitting unit 21 and the second light emitting diodes 23A and 23B of the second light emitting unit 23 are turned on. Then, when the DC power of the normal level is cut off for power-off, the first and second light emitting diodes 21A, 21B, 23A and 23B are turned off. At this time, an abnormal level of DC power is applied to the first light emitting unit 21 adjacent to the control unit 41 or electrically connected to the control unit 41, so that a leakage current can be input. The leakage current is a low current due to a DC power supply of a non-normal level. Here, the DC power of the non-normal level may be an abnormal voltage or a residual voltage lower than a normal DC voltage. The first light emitting diodes 21A and 21B of the first light emitting unit 21 may be lightly turned on by the leakage current. That is, the afterglow can be generated by the first light emitting unit 21.

The first light emitting diodes 21A and 21B in which the afterglow is generated are dispersed and disposed on the circuit board 11 so that the afterglow is dispersed to lower the visibility of the afterglow. If the first and second light emitting diodes 21A and 21B are not dispersed, afterglow is generated in a region adjacent to the power input terminal E1, and such the afterglow may cause a light imbalance with other light emitting diodes. The light source module of the embodiment can disperse and dispose a plurality of the first light emitting units 21, thereby reducing visibility due to afterglow and alleviating the light unbalance.

Also, since the first light emitting diodes 21A and 21B are dispersedly disposed at a uniform interval D1, the light intensity of the minute lighting can be lowered on the side of the light source module 10, and the imbalance of afterglows can be alleviated.

The number of the first light emitting diodes 21A and 21B which can be afterglowed with respect to the total number of the light emitting diodes 20 of the light source module 10 may be 30% or less, for example, 20% to 26%. The number of the first light emitting diodes 21A and 21B may be different depending on the size of the supplied DC power source or leakage current and the characteristics of the control unit 41. The abnormal voltage or residual voltage applied to each of the first light emitting diodes 21A and 21B may be lower than the driving voltage of the light emitting diode 20 and may range from 2.6V to 2.2V, The abnormal voltage or the afterglow voltage applied to each of the first light emitting diodes 21A and 21B may be normally driven when the voltage exceeds the above range. If the voltage is less than the above range, there is no effect of dispersing afterglow.

The leakage current flowing through each of the first light emitting diodes 21A and 21B may be in a range of 5 µA or less, for example, in a range of 1.7 µA to 2.2 µA. If the leakage current exceeds the above range, the current loss may be large. The light intensity may be low and there may be no effect of dispersing.

Figure 3:
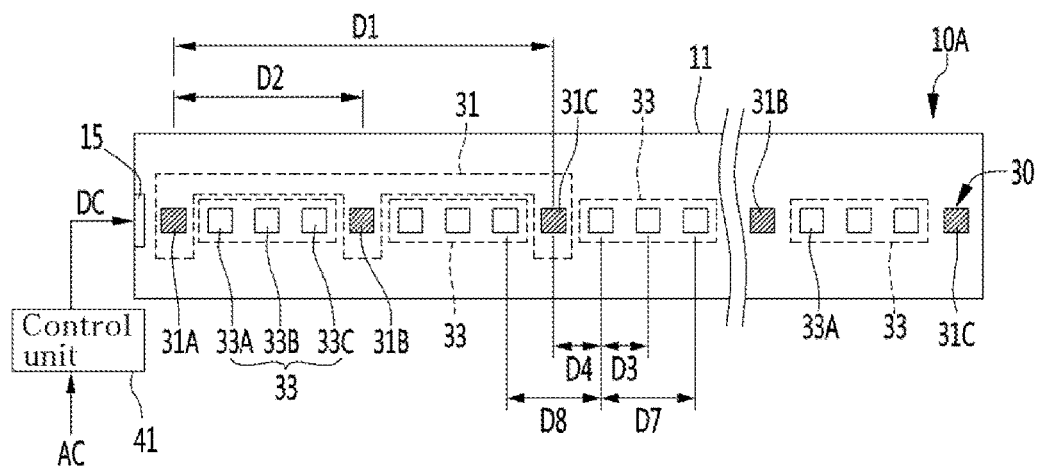
FIG. 3 is a view showing another example of the light source module according to the embodiment.
Figure 4:
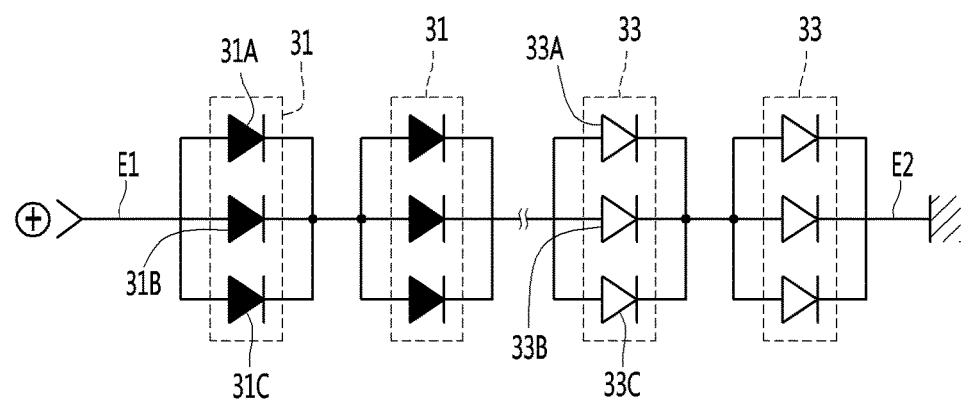
FIG. 4 is a circuit diagram of the light source module of FIG. 3.

FIG. 3 is another example of the light source module of FIG. 1, and FIG. 4 is an example of the circuit diagram of FIG. 3.

Referring to FIGS. 3 and 4, the light source module 10A includes a circuit board 11, a first light emitting unit 31 and a second light emitting unit 33 having a plurality of light emitting diodes 30 on the circuit board 11. The plurality of light emitting diodes 30 may be arranged on the circuit board 11 in at least one column or two or more columns.

The first light emitting unit 31 may include a plurality of first light emitting diodes 31A, 31B, and 31C. The second light emitting unit 33 may include a plurality of second light emitting diodes 33A, 33B, and 33C. The light emitting diode 30 may include first light emitting diodes 31A, 31B and 31C and second light emitting diodes 33A, 33B and 33C. The first light emitting unit 31 and the second light emitting unit 33 may be arranged on the circuit board 11 in at least one or two rows. As another example, the first light emitting unit 31 and the second light emitting unit 33 may be arranged in different columns.

The light emitting diode 30 may emit the same color, e.g., white light. Each of the light emitting diodes 30 may include at least one LED chip that selectively emits light in the ultraviolet band from visible light.

The light emitting diodes 30 may have the same or different color temperatures of white light. The first light emitting diodes 31A, 31B and 31C according to the embodiment may be a cool white LED and the second light emitting diodes 33A, 33B and 33C may be a warm white LED. As another example, the first light emitting diodes 31A, 31B, and 31C may be a warm white LED, and the second light emitting diodes 33A, 33B, and 33C may be a cool white LED. Alternatively, the second light emitting diodes 33A, 33B and 33C may be arranged as a warm white LED and a cool white LED. The light source module 10A emits mixed white light emitted by the first light emitting diodes 31A, 31B and 31C and the second light emitting diodes 33A, 33B and 33C. Accordingly, it is possible to provide a white light source module capable of easily controlling emotional illumination.

The first light emitting unit 31 and the second light emitting unit 33 may be connected in series. The first light emitting units 31 may be disposed on the circuit board 11, for example, one or more. When a plurality of the first light emitting units 31 are arranged, the plurality of first light emitting units 31 may be connected to each other in series. As another example, the plurality of second light emitting units 31 may be connected to each other in parallel.

The plurality of first light emitting units 31 may be disposed at input terminals of the second light emitting unit 33. The output terminal of the plurality of first light emitting units 31 may be connected to the input terminal of the second light emitting unit 33. The one or more first light emitting units 31 may be connected between the connector 15 and the second light emitting unit 33.

The plurality of the second light emitting units 33 may be disposed on the circuit board 11 for example, one or more. The second light emitting unit 33 may be connected to the one or more first light emitting units 31 in series. When a plurality of the second light emitting units 33 are disposed, the plurality of second light emitting units 33 may be connected in series with each other. As another example, the plurality of second light emitting units 33 may be connected to each other in parallel.

Anodes of the plurality of first light emitting diodes 31A, 31B and 31C of the first light emitting unit 31 may be connected to the power input terminal E1. When the plurality of first light emitting units 31 are disposed, an anode of the first light emitting diodes 31A, 31B, and 31C of the first light emitting unit may be connected to the power input terminal E1. The power input terminal E1 may be a positive terminal connected to the connector 15, but is not limited thereto.

The second light emitting unit 33 includes a plurality of second light emitting diodes 33A, 33B and 33C and a plurality of second light emitting diodes 33A, 33B, and 33C disposed in the second light emitting unit 33, are connected in parallel with each other. The plurality of second light emitting diodes 33A, 33B and 33C of the second light emitting unit 33 may be connected to the output ends of the plurality of first light emitting units 31. The anodes of the plurality of second light emitting diodes 33A, 33B, and 33C may be connected to the output terminals of the plurality of first light emitting units 31. The anodes of the plurality of second light emitting diodes 33A, 33B and 33C may be connected to the cathodes of the first light emitting diodes 31A, 31B and 31C. When a plurality of the second light emitting units 33 are arranged, the anode of the second light emitting diodes 33A, 33B and 33C of the first second light emitting unit 33 is connected to the last first light emitting unit 31 and the last second light emitting unit 33 may be connected to the second polarity terminal E2 or may be connected to a terminal of another LED array. The plurality of first light emitting diodes 31A, 31B and 31C and the plurality of second light emitting diodes 33A, 33B and 33C may be connected in a circuit.

A plurality of, for example, three or more first light emitting diodes 31A, 31B, and 31C of the first light emitting unit 31 may be connected in parallel to each other. The plurality of second light emitting diodes 33A, 33B, and 33C of the second light emitting unit 33 may be connected in parallel to each other. The number of the first light emitting diodes 31A, 31B and 31C of the first light emitting unit 31 may be equal to the number of the second light emitting diodes 33A, 33B and 33C of the second light emitting unit 33, Three, four or five.

The distance D2 between the plurality of first light emitting diodes 31A, 31B and 31C may be wider than the distance D3 between the second light emitting diodes 33A of the second light emitting unit 33. The interval D2 may be four times or more the interval D3. The interval D7 of the second light emitting units 33 may be equal to the interval D8 between the adjacent second light emitting units 33.

The second light emitting unit 33 is disposed between the first light emitting diodes 31A, 31B and 31C of the first light emitting unit 31. For example, the second light emitting diodes 33A and 33B, 33C may be disposed.

When the adjacent light emitting diodes are disposed at uniform intervals D3 and D4, The second light emitting diodes 33A, 33B and 33C may be dispersed among the first light emitting units 31. The first light emitting diodes 31A, 31B, and 31C may be dispersed by the second light emitting unit 33. For example, each of the first light emitting diodes 31A, 31B, and 31C may be disposed between three or more second light emitting diodes 33A, 33B, and 33C, respectively. The first light emitting diodes 31A, 31B and 31C and the second light emitting diodes 33A, 33B and 33C are arranged in a single row or a straight line so that the interval between the first light emitting diodes 31A, 31B and 31C D2 of the first light emitting diodes 31A, 31B, and 31C may be spaced apart from the interval D1 of FIG. 1, and the visibility of the first light emitting diodes 31A, 31B, and 31C may be further reduced. In addition, the unevenness in luminous intensity at the time of afterglow by the first light emitting diodes 31A, 31B and 31C can be further eliminated.

In an embodiment, the number of the first light emitting diodes 31A that can be afterglowed may be 30% or less, for example, 20% to 26% of the total number of the light emitting diodes 30 of the light source module. The number of the first light emitting diodes 31A may vary depending on the size of the supplied DC power source or leakage current, and the characteristics of the control unit 41. The unsteady voltage or the afterglow voltage applied to each of the first light emitting diodes 31A may be lower than the driving voltage of the light emitting diode, and may range from 2.6V or less, for example, 2.2V to 2.5V. The steady-state voltage or the afterglow voltage applied to each of the first light-emitting diodes 31A can be normally driven when it exceeds the above range, and if it is less than the above range, there is no effect of dispersing the afterglow.

The leakage current flowing through each of the first light emitting diodes 31A may be in a range of 5 μA or less, for example, in a range of 1.7 μA to 2.2 μA. If the leakage current exceeds the range, the current loss may be large. It may not be effective to disperse it.

Figure 5:
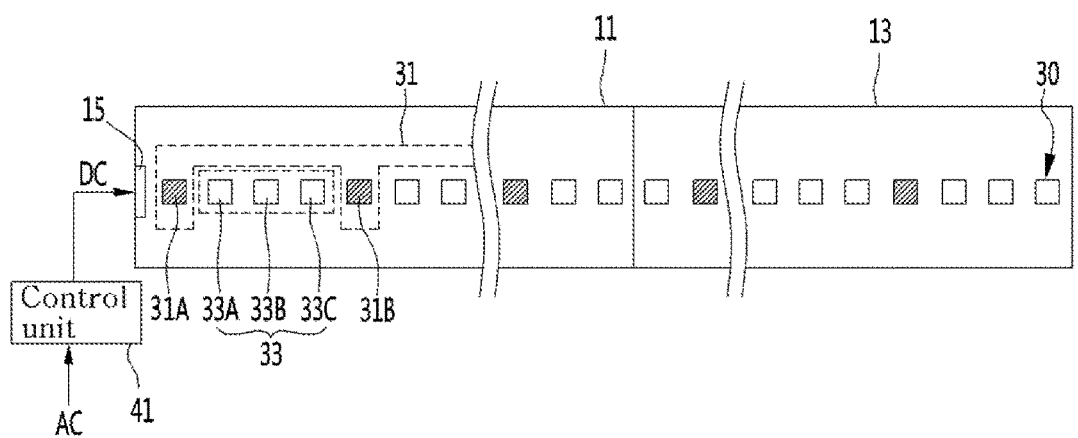
FIG. 5 is a view showing another example of the light source module according to the embodiment.

Referring to FIG. 5, the light source module includes a plurality of circuit boards 11 and 13, and a first light emitting unit 31 and a second light emitting unit 33 disposed on the plurality of circuit boards 11 and 13.

The first and second light emitting units 31 and 33 will be described with reference to FIG. 3. The first light emitting diodes 31A, 31B and 31C of the first light emitting unit 31 may include two or more, for example, two to four, The number of the diodes 33A, 33B and 33C may be the same as the number of the first light emitting diodes 31A, 31B and 31C of the first light emitting unit 31.

A plurality of first light emitting units 31 are connected in circuit on the circuit boards 11 and 13 and a plurality of second light emitting units 33 are connected to output terminals of the plurality of first light emitting units 31.

The first light emitting diodes 31A, 31B and 31C of the first light emitting unit 31 are dispersedly disposed at both ends of the second light emitting unit 33 so that the first light emitting diodes 31A, When the leakage current flows in the light-emitting layer.

The number of the first light emitting diodes 31A, 31B, and 31C that can be afterglowed may be 30% or less, for example, 20% to 26% of the total number of the light emitting diodes 30 of the light source module. The number of the first light emitting diodes 31A, 31B, and 31C may vary depending on the size of the supplied DC power source or leakage current, and the characteristics of the control unit 41. The unsteady voltage or the afterglow voltage applied to each of the first light emitting diodes 31A, 31B, and 31C may be lower than the drive voltage of the light emitting diode, and may be 2.6V or less, for example, 2.2V to 2.5V. The abnormal voltage or the afterglow voltage applied to each of the first light emitting diodes 31A, 31B, and 31C may be normally driven when the voltage exceeds the above range. If the voltage is less than the above range, there is no effect of dispersing afterglow.

The leakage current flowing through each of the first light emitting diodes 31A, 31B and 31C may be in a range of 5 μA or less, for example, in a range of 1.7 μA to 2.2 μA. If the leakage current exceeds the above range, the current loss may be large. The brightness of the afterglow is low and there is no effect of dispersing.

Figure 7:
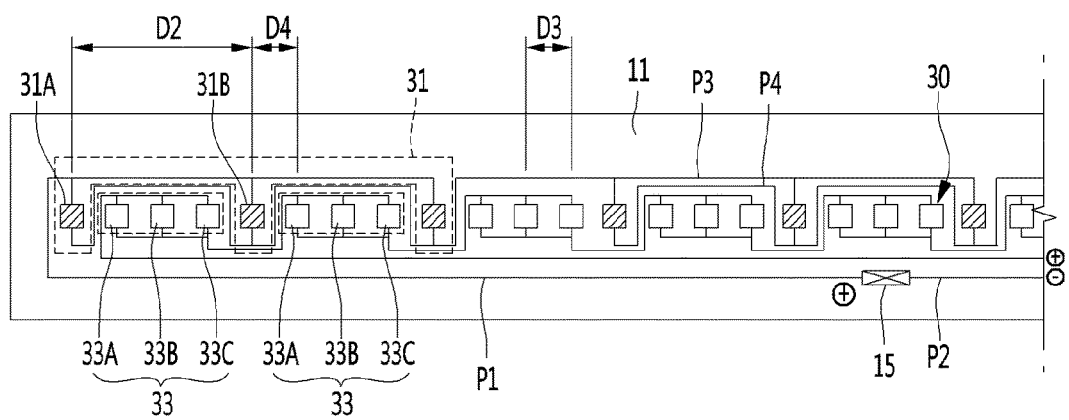
FIG. 7 is a partial detail view of the light source module of FIG. 6.
Figure 8:
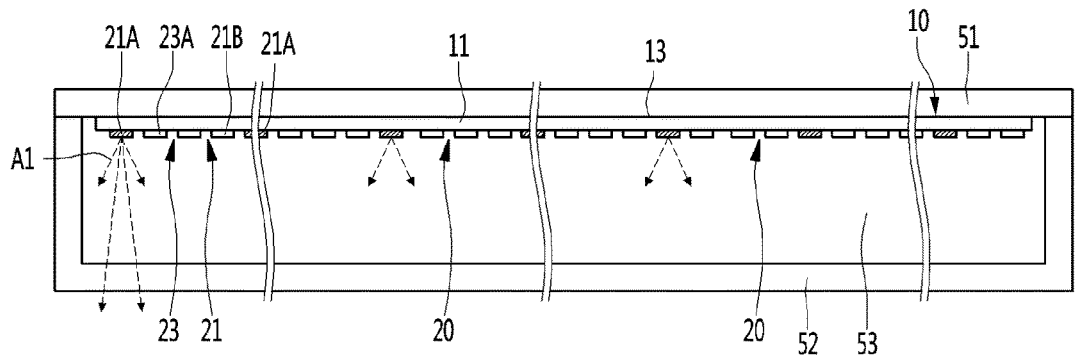
FIG. 8 is a view illustrating a lighting device having a light source module according to an embodiment.

FIG. 7 is another example of the light source module, and FIG. 8 is a partial detail view of FIG. 7.

Referring to FIGS. 7 and 8, the light source module includes one or a plurality of circuit boards 11, and includes first and second light emitting units 31 and 33 on the circuit board 11.

The circuit board 11 includes a first wiring P1 and a second wiring P2 and the first and second wirings P1 and P2 may be connected to the connector 15. The first wiring P1 is supplied with a positive polarity power and is connected to the first light emitting unit 31. The first wiring P1 may be a wiring connected to a power input terminal. The second wiring P2 is supplied with a negative power and is connected to the second light emitting unit 33. The second wiring P2 may be a wiring connected to a power output terminal. The second light emitting unit 33 may receive a positive power supply through the fifth wire P5 fed back.

A third wiring P3 connected to the anode of the first light emitting diode 31A, 31B and 31C of the first light emitting unit 31 and a fourth wiring P4 connected to the cathode, May be disposed outside the fourth wiring P4. At least one of the third and fourth wires P3 and P4 may be disposed outside the second light emitting diodes 33A, 33B, and 33C of the second light emitting units 33. The third and fourth wirings P3 and P4 may be disposed on the opposite sides of the first and second wirings P1 and P2 with respect to the row of the light emitting diode 30.

The plurality of first light emitting diodes 31A, 31B and 31C of the first light emitting unit 31 are arranged at a predetermined distance D2 and the plurality of second light emitting diodes 33A, 33B, and 33C may be disposed between the first light emitting diodes 31A, 31B, and 31C. The plurality of light emitting diodes 30 may be arranged in a straight line or a column. As another example, the light emitting diode 30 may be arranged in a plurality of straight lines or a plurality of columns. That is, the first light emitting diodes 31A, 31B, and 31C and the second light emitting diodes 33A, 33B, and 33C may be arranged in a matrix.

Figure 6:
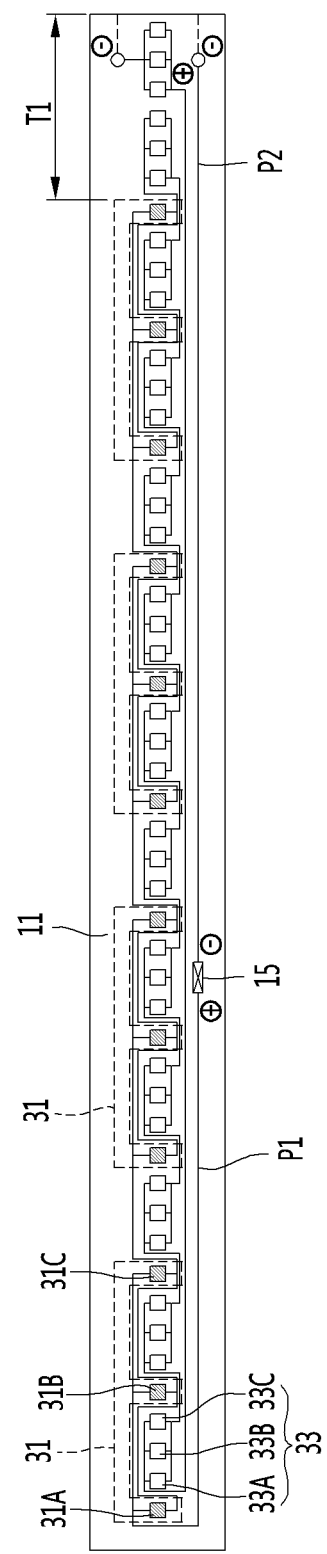
FIG. 6 is a view showing an example of connection of the first and second light emitting units by wiring in the light source module according to the embodiment.

In FIG. 6, the first light emitting diodes 31A, 31B, and 31C of the first light emitting unit 31 may be spaced apart from each other by a predetermined distance Ti from a portion of the second light emitting diode 31 bonded to the second circuit substrate 13 in FIG. 5. The spacing distance Ti may be less than the spacing D1 in FIG. This can be determined by the circuit complexity at the boundary between adjacent first and second circuit boards 11 and 13 and the current intensity due to the residual voltage.

The first light emitting diodes 31A, 31B and 31C may be disposed at an interval D2 which is wider than the interval D3 of the second light emitting diodes 33A, 33A and 33B of the second light emitting unit 33. When the adjacent light emitting diodes are arranged at uniform intervals D3 and D4, the second light emitting diodes 33A, 33B, and 33C may be periodically dispersed. For example, each of the first light emitting diodes 31A, 31B, and 31C may be disposed between three or more second light emitting diodes 33A, 33B, and 33C, respectively. The first light emitting diodes 31A, 31B and 31C and the second light emitting diodes 33A, 33B and 33C are arranged in a single row or a straight line, D2 may be spaced apart from the interval D1 in FIG. Therefore, the visibility of the first light emitting diodes 31A, 31B, and 31C in the light source module when the light is dimmed can be reduced.

The number of the first light emitting diodes 31A, 31B and 31C that can be after glowed may be in the range of 30% or less, for example, 20% to 26% of the total number of the light emitting diodes of the light source module. The number of the first light emitting diodes 31A, 31B, and 31C may be different depending on the DC power source, the magnitude of the leakage current, and the characteristics of the control unit. The unsteady voltage or the afterglow voltage applied to each of the first light emitting diodes 31A, 31B, and 31C may be lower than the drive voltage of the light emitting diode, and may be 2.6V or less, for example, 2.2V to 2.5V. The abnormal voltage or the afterglow voltage applied to each of the first light emitting diodes 31A, 31B, and 31C may be normally driven when the voltage exceeds the above range. If the voltage is less than the above range, there is no effect of dispersing afterglow.

The leakage current flowing through each of the first light emitting diodes 31A, 31B and 31C may be in a range of 5 µA or less, for example, in a range of 1.7 µA to 2.2 µA. If the leakage current exceeds the above range, the current loss may be large. The brightness of the afterglow is low and there is no effect of dispersing.

FIG. 8 is a view illustrating a lighting device having a light source module according to an embodiment.

Referring to FIG. 8, the lighting apparatus includes a back cover 51 having a light source module 10 of the above-described embodiment fixed to the back cover 51, a front cover 51 to which light is transmitted under the back cover 51.

The back cover 51 is fixed to a ceiling of an illuminating device, for example, and supplies power to the circuit boards 11 and 13 of the light source module 10 to provide heat radiation members.

The front cover 53 includes transparent plastic or glass material, and diffuses the light incident from the light source module 10 to be irradiated.

The area 53 between the front cover 51 and the light source module 10 may be an air area or other transparent member, but is not limited thereto.

The light A1 emitted from the first light emitting diode 31A when the power source is turned off in the light source module 10 can be uniformly distributed by the dispersed first light emitting diode 31A as afterglow, 51, the visibility of the light can be reduced.

Figure 9:
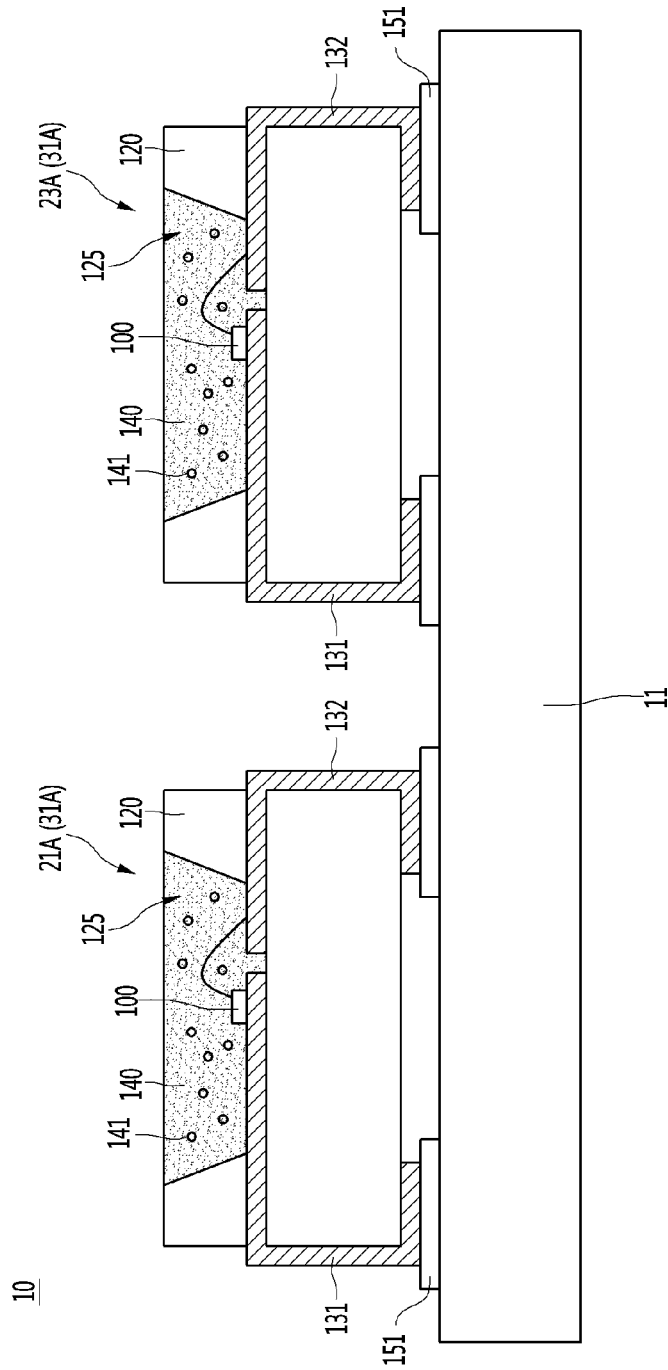
FIG. 9 is a view illustrating first and second light emitting diodes of the light source module according to the embodiment.

FIG. 9 is a view showing a light emitting device according to an embodiment.

Referring to FIG. 9, in the light source module 10 according to the embodiment, the light emitting diodes 21A and 23A of the first and second light emitting units described above are bonded to the circuit board 11 with the bonding member 151. The first and second light emitting units may include the light emitting units shown in FIGS. 1 to 8. Each of the light emitting units may include two or more than three light emitting diodes connected in series, parallel, serial-parallel. For convenience of explanation, the first light emitting diode 21A of the first light emitting unit and the second light emitting diode 23A of the second light emitting unit will be described.

The light emitting diodes 21A and 23A of the first and second light emitting units include a body 120, a first lead electrode 131 and a second lead electrode 132 disposed on the body 120, light emitting chip 100 provided on the first lead electrode 120 and electrically connected to the first lead electrode 131 and the second lead electrode 132 and a molding member 140 including a first phosphor 141 covering the light emitting chip 100.

The body 120 may include a silicon material, a synthetic resin material, or a metal material. The body 120 may include a cavity 125 having an inclined surface around the light emitting chip 100.

The first lead electrode 131 and the second lead electrode 132 are electrically separated from each other and provide power to the light emitting chip 100. The first lead electrode 131 and the second lead electrode 132 may increase the light efficiency by reflecting the light generated from the light emitting chip 100. The heat generated from the light emitting chip 100 to the outside.

The light emitting chip 100 may be disposed on the body 120 or on at least one of the first lead electrode 131 and the second lead electrode 132.

The light emitting chip 100 may be electrically connected to the first lead electrode 131 and the second lead electrode 132 by a wire, flip chip or die bonding method.

The light emitting chip 100 of the light emitting diodes 21A and 23A can emit the same peak wavelength, for example, a blue peak wavelength. As another example, the light emitting chips 100 of the first and second light emitting diodes 21A and 23A may emit different peak wavelengths. For example, the light emitting chip 100 of the first light emitting diode 21A emits a blue peak wavelength, and the light emitting chip 101 of the second light emitting diode 23A emits ultraviolet peak wavelengths.

The molding member 140 of the first and second light emitting diodes 21 and 23 can surround the light emitting chip 100 to protect the light emitting chip 100.

The phosphor 141 may be included in the molding member 140 of the first and second light emitting diodes 21A and 23A. The phosphor 141 can change the wavelength of the light emitted from the light emitting chips 100 and 101. The phosphors 141 of the first and second light emitting diodes 21A and 23A may include phosphors of the same type. The first and second light emitting diodes 21A and 23A may have different contents of the phosphors 141. The first or second light emitting diodes 21A and 23A may be implemented as a warm white LED or a cool white LED.

The phosphor 141 of the first light emitting diode 21A may include a yellow phosphor or a green phosphor and an orange phosphor and the phosphor 141 of the second light emitting diode 23A may include at least two or more of blue, green, yellow phosphor and a red phosphor.

Here, the first color temperature of the light emitted from the first light emitting diode 21A may be such that the color temperature of the white light becomes lower as the amount of the yellow phosphor added increases. For example, a relatively white color with a relatively low color temperature corresponds to a relatively warm white color, and a relatively white color with a relatively high color temperature corresponds to a relatively cool white color. That is, the color temperature of the first and second light emitting diodes 21A and 23A may vary depending on the amount of the phosphor material and the phosphor used.

When the current supplied to the first light emitting diode 21A is controlled and increased, the color temperature of the final output white light can be lowered. On the contrary, by reducing the current flowing through the second light emitting diode 23A, the temperature can be increased.

In another embodiment, the light source module described in the above embodiments may include an indoor lighting lamp, a lamp, a streetlight, an electric signboard, and a headlight. Further, the lighting apparatus according to the embodiment can be applied to a tail lamp as well as a car headlight.

As another example, a lens, a light guide plate, a prism sheet, a diffusing sheet etc. which are optical member may be disposed in the light path of the light emitting devices according to the previous embodiments. The light emitting devices and circuit boards may function as a light unit. The light unit may be implemented in a top view or a side view type to be provided displays of a mobile terminal, a notebook etc., or to be applied to a lighting device and an indicator in various ways.

The present invention is limited not to the embodiments described above and the accompanying drawings, but to the claims. Accordingly, it would be apparent to those skilled in the art that the present invention may be replaced, changed, and modified in various ways without departing from the scope of the present invention, and those replacement, change, and modification should be construed as being included in the accompanying drawings.

INDUSTRIAL APPLICABILITY

The light source module according to the embodiment can be applied to an indoor lighting, a lamp, a streetlight, an electric signboard, a headlight, or a tail lamp.

The light source module according to the embodiment can be applied to a display device such as a portable terminal and a notebook computer.

The invention claimed is:

1. A lighting source module comprising:
a circuit board; and
a plurality of light emitting diodes arranged on the circuit board,
wherein the plurality of light emitting diodes include a plurality of first light emitting diodes connected to a power input terminal, and a plurality of second light emitting diodes connected to output ends of the plurality of first light emitting diodes,
wherein the plurality of first light emitting diodes are spaced apart from each other,
wherein at least two of the plurality of second light emitting diodes are disposed between the first light emitting diodes, respectively,
wherein the plurality of first light emitting diodes emit white light having a first color temperature,
wherein the plurality of second light emitting diodes emit white light having a second color temperature different from the first color temperature,
wherein the plurality of first light emitting diodes are electrically connected to each other,
wherein the plurality of second light emitting diodes are electrically connected to each other, and
wherein an interval between the plurality of first light emitting diodes is narrower than an interval between the second light emitting diodes.

2. The light source module of claim 1, wherein a plurality of first light emitting units having at least two of first light emitting diodes are connected in series, and
wherein at least two first light emitting diodes disposed each of the plurality of first light emitting units are connected in parallel from each other.

3. The light emitting device of claim 2, wherein the plurality of second light emitting units having at least two of the plurality of second light emitting diodes are connected in series from each other,
wherein the at least two second light emitting diodes disposed each of the plurality of second light emitting units are connected in parallel from each other, and
wherein at least two second light emitting diodes are disposed between the first light emitting diodes disposed in each of the first light emitting units and are connected in parallel.

4. The light emitting device of claim 3, wherein the first light emitting unit has three or more first light emitting diodes connected in parallel, and wherein the second light emitting diodes of the second light emitting units are equal to the first light emitting diodes of the first light emitting units Light source module.

5. The light source module of claim 3, wherein the plurality of second light emitting diodes are arranged in one row between the first light emitting diodes.

6. The light source module of claim 5, wherein the plurality of first light emitting diodes and the plurality of second light emitting diodes are arranged in one column along the circuit board.

7. The light source module of claim 5, wherein the plurality of first light emitting units are connected in series between an power input terminal and the plurality of second light emitting units.

8. The light source module of claim 4, wherein a plurality of the circuit boards are arranged, and the first light emitting unit and the second light emitting unit are arranged on the plurality of circuit boards.

9. The light source module of claim 2, wherein the circuit board includes a connector, and the connector is connected to a positive terminal of the first light emitting unit.

10. The light source module of claim 1, wherein a number of the first light emitting diodes on the circuit board is 30% or less of a total number of the light emitting diodes.

11. The light source module of claim 1, wherein an interval between the first light emitting diodes is three times or more an interval between the second light emitting diodes.

12. A lighting source module comprising:
a circuit board;
a plurality of first light emitting units having a plurality of first light emitting diodes arranged on the circuit board; and
a plurality of second light emitting units connected to the first light emitting unit on the circuit board and having a plurality of second light emitting diodes,
wherein the plurality of first light emitting units are connected to each other,
and each of the plurality of first light emitting units,
wherein the plurality of first light emitting diodes arranged are spaced apart from each other,
wherein the plurality of second light emitting units are connected to each other,
wherein the plurality of second light emitting diodes disposed in each of the plurality of second light emitting units are connected to each other,
wherein each of the second light emitting units connected is disposed between the first light emitting diodes of the first light emitting unit, and
wherein an interval between the first light emitting diodes arranged in the first light emitting unit is greater than an interval between the second light emitting diodes arranged in the second light emitting unit.

13. The light source module of claim 12, wherein the first light emitting unit is connected to a power input terminal, and the second light emitting unit is connected to a power output terminal.

14. The light source module of claim 12, wherein the first light emitting diode of the first light emitting unit is connected to the positive polarity terminal.

15. The light source module of claim 12, wherein the second light emitting diodes of the second light emitting units are arranged in at least one row between the first light emitting diodes of the first light emitting units.

16. The light source module of claim 12, wherein a number of the first light emitting diodes disposed in the first light emitting unit is equal to a number of the second light emitting diodes in the second light emitting unit.

17. The light emitting device of claim 12, wherein the first light emitting diodes disposed in the first light emitting unit are connected in parallel to each other, and the second light emitting diodes disposed in the second light emitting unit are connected in parallel.

18. The light source module of claim 17, wherein the first light emitting units are connected to each other in series, the second light emitting units are connected to each other in series, and the first and second light emitting units are connected to each other in series.

19. The light emitting device of claim 18, wherein the circuit board includes a plurality of circuit boards connected to each other,
wherein the first and second light emitting units are disposed on the plurality of circuit boards,
wherein the first and second light emitting diodes are arranged in one column and an interval between the first light emitting diodes is at least three times an interval between the second light emitting diodes.

20. The light emitting device of claim 12, wherein the first light emitting diode of the first light emitting unit emits light abnormally by a DC power source of a non-normal level drawn into the circuit board, and
wherein a number of the light emitting diodes is 30% or less of a total number of the first and second light emitting diodes.

* * * * *